(12) United States Patent
Hsu et al.

(10) Patent No.: US 7,642,564 B2
(45) Date of Patent: Jan. 5, 2010

(54) ELECTRONIC COMPONENT ASSEMBLY WITH COMPOSITE MATERIAL CARRIER

(75) Inventors: Chia-Liang Hsu, Hsinchu (TW); Chien-Fu Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 119 days.

(21) Appl. No.: 12/078,672

(22) Filed: Apr. 3, 2008

(65) Prior Publication Data

US 2008/0246052 A1    Oct. 9, 2008

(30) Foreign Application Priority Data

Apr. 4, 2007    (TW) .............................. 96112292 A

(51) Int. Cl.
*H01L 33/00* (2006.01)
*H01L 21/00* (2006.01)

(52) U.S. Cl. .......................................... 257/99; 438/69

(58) Field of Classification Search ............. 438/22–25, 438/64–69; 257/84, 99
See application file for complete search history.

(56) References Cited

U.S. PATENT DOCUMENTS

| 7,202,558 B2 * | 4/2007 | Kuramachi | 257/702 |
| 7,391,153 B2 * | 6/2008 | Suehiro et al. | 313/512 |
| 2006/0076571 A1 * | 4/2006 | Hsieh et al. | 257/99 |

* cited by examiner

*Primary Examiner*—Calvin Lee
(74) *Attorney, Agent, or Firm*—Bacon & Thomas, PLLC

(57) ABSTRACT

The present invention relates to an electronic component assembly including a composite material carrier, a circuit carrier made of a dielectric material, a circuit with a conductive material formed on the circuit carrier, an intermediate layer between the circuit carrier and the composite material carrier, and an electronic component arranged on the composite material carrier and electrically connecting to the circuit.

16 Claims, 5 Drawing Sheets

US 7,642,564 B2

1

ELECTRONIC COMPONENT ASSEMBLY WITH COMPOSITE MATERIAL CARRIER

TECHNICAL FIELD

The invention relates to an electronic component assembly, and more particularly to an electronic component assembly having a composite material carrier.

REFERENCE TO RELATED APPLICATION

This application claims the right of priority based on TW application Ser. No. 096112292, filed Apr. 4, 2007, and the content of which is hereby incorporated by reference.

DESCRIPTION OF BACKGROUND ART

With the popularity of light-emitting diodes (LEDs), the variety of sizes of bare chips provided by manufacturers also grows. When the size of a bare chip increases, the light output uplifts under a constant current density. However, the heat imposed on the chip also climbs with the increase of input current.

A conventional LED lamp of 5 mm package size has a thermal resistance in the range of 250° C./W~300° C./W. Provided a high power chip is packaged in a conventional configuration, owing to poor heat dissipation, the surface temperature of the chip is expected to rise rapidly, and the surrounding epoxy is carbonized and discolored. Accordingly, the decay of the chip radiation performance is accelerated till failed. Furthermore, a thermal expansion stress due to a sharp temperature change possibly causes damage to the package structure.

Up to now, the high power LED is generally packaged by forming an insulating material, e.g. epoxy, oxide, and nitride, on a metallic substrate, e.g. Al, and Cu. However, the metallic substrate usually has a thermal expansion coefficient (CTE) greatly different from that of the insulating material. For example, the CTE of Al is about $2.3 \times 10^{-5}/°$ C., and the CTE of epoxy is about $5 \sim 6 \times 10^{-5}/°$ C. The CTE of an LED epitaxial material is usually smaller than $1 \times 10^{-5}/°$ C., or in the range of $4 \sim 8 \times 10^{-6}/°$ C. For example, the CTE of $Al_2O_3$ or AlN is about $4 \sim 8 \times 10^{-6}/°$ C. At an operation temperature higher than 60° C., the chip easily splits at the interface with the metallic substrate due to the thermal expansion coefficient difference between those materials.

Moreover, the heat crowding in the high-current-driven chip also deteriorates the light output performance of an LED. The silver paste used to fasten the chip has a lower thermal conductivity, and therefore cannot provide a suitable thermal passage for heat transmitting to the metallic substrate. In consequence, the heat from the chip is easily crowded in some regions, which worsen the photoelectric characteristics and the reliability of the chip.

SUMMARY OF THE DISCLOSURE

An electronic component assembly of present invention includes a composite material carrier; a circuit carrier made of a first dielectric material; a circuit formed on the circuit carrier and including a conductive material; an intermediate layer between the circuit carrier and the composite material carrier, and comprising at least one material selected from the group consisting of Ni, Ti, Cr, Al, W, Si, Mo, metal carbide, and the combination thereof; and an electronic component arranged on the composite material carrier and electrically connecting to the circuit.

2

In one embodiment, the electronic component assembly further includes an outer layer covering an outer surface of the composite material carrier. The outer layer comprises at least one material selected form the group consisting of Ni, Ti, Cr, Cu, Au, Al, Pt, TiW, Pd, and Mo.

In a preferable embodiment, the composite material carrier of the electronic component assembly is selected from the group consisting of metal matrix composite (MMC), polymer matrix composite (PMC), and ceramic matrix composite (CMC).

The first dielectric material is selected from the group consisting of $CaCO_3$, $SiO_2$, $Al_2O_3$, MgO, $Bi_2O_3$, Tc, Pr, Po, Fr, Ra, BeO, $B_2O_3$, $Li_2O$, ZnO, $WS_2$, $RuO_2$, $SnO_2$, $LaB_6$, $In_2O_3$, $Ta_2N$, $BaTiO_3$, CuO, CdO, and $Ta_2O_5$.

The conductive material is selected from the group consisting of Au, Ag, Al, Cu, W, Ni, Pd, and Pt.

The electronic component is selected from the group consisting of light-emitting diode, laser diode, transistor, integrated circuit, and solar cell. Specifically, the electronic component includes an n-type semiconductor layer; a p-type semiconductor layer; and a light-emitting layer between the n-type semiconductor layer and the p-type semiconductor layer.

In embodiments, the composite material carrier has a thermal expansion coefficient not greater than $1.2 \times 10^{-5}/°$ C. The composite material carrier has a thermal conductivity not less than 150 W/m° K. The thermal expansion coefficient difference between the composite material carrier and the electronic component is not greater than $1 \times 10^{-5}/°$ C.

The composite material carrier comprises at least one material selected from the group consisting of carbon fiber, carbon particulate, carbon flake, carbon laminate, carbon nanotube, diamond, diamond-like carbon, and graphite.

In further embodiment, the electronic component is positioned on the composite material carrier in a flip-chip configuration.

In another embodiment, the electronic component assembly further includes a connecting means for connecting the composite material carrier and the electronic component, wherein the connecting means is selected from the group consisting of screwing, snap fitting, friction fitting, glue bonding, eutectic bonding, ultrasonic bonding, pressure bonding, and surface active bonding.

The connecting means optionally includes a bonding layer comprising at least one material selected from the group consisting of, Benzocyclobutene (BCB), epoxy, polyimide, SOG, silicone, solder, Au, Ag, Al, Cu, Ni, Pd, Pt, $CaCO_3$, $SiO_2$, $Al_2O_3$, MgO, $Bi_2O_3$, Tc, BeO, $B_2O_3$, $Li_2O$, $RuO_2$, $SnO_2$, $LaB_6$, $In_2O_3$, $Ta_2N$, $BaTiO_3$, CuO, CdO, and $Ta_2O_5$.

In another embodiment, the circuit carrier of the electronic component assembly further includes a second dielectric material. The dielectric material is selected from the group consisting of $CaCO_3$, $SiO_2$, $Al_2O_3$, MgO, $Bi_2O_3$, Tc, Tr, Po, Fr, Ra, BeO, $B_2O_3$, $Li_2O$, ZnO, $WS_2$, $RuO_2$, $Bi_2Ru_2O_7$, $PbRu_2O_6$, $IrO_2$, $SnO_2$, $LaB_6$, $In_2O_3$, $Ta_2N$, $BaTiO_3$, CuO, CdO, and $Ta_2O_5$.

DETAILED DESCRIPTION OF PREFERRED EMBODIMENTS

The embodiments of the invention are described in accompany with drawings.

Figure 1:
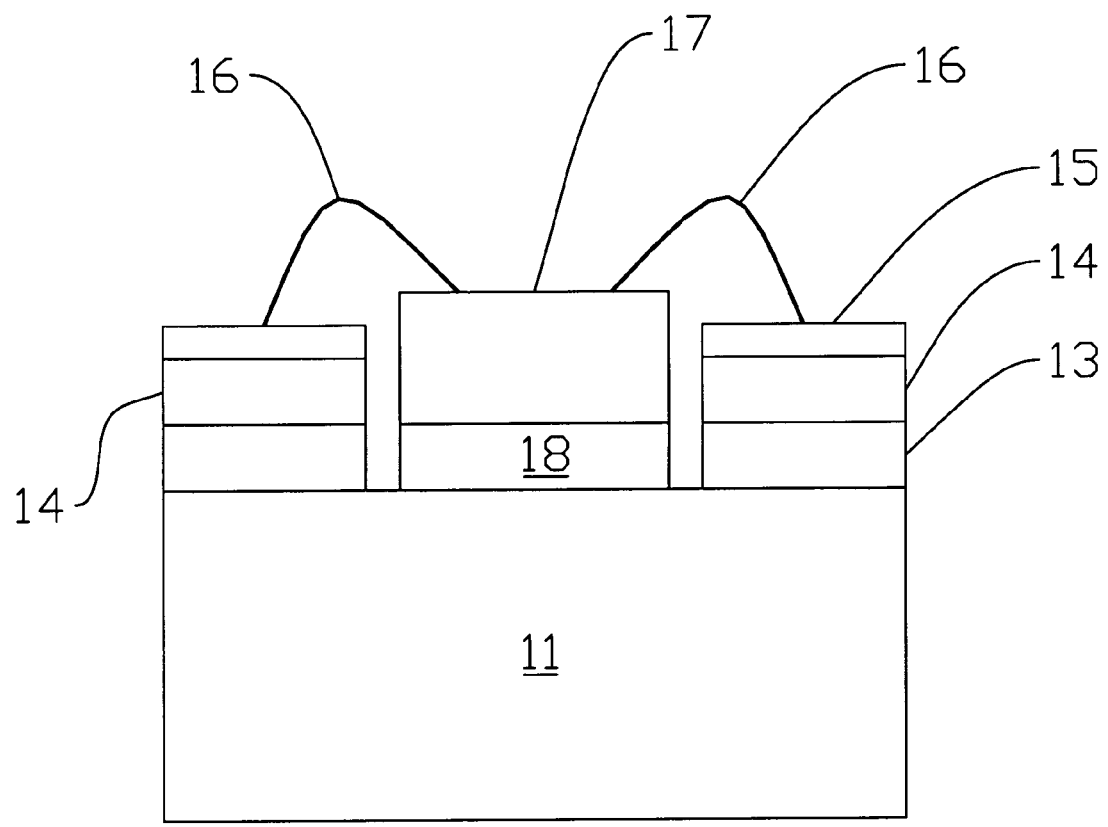
FIG. 1 illustrates an electronic component assembly in accordance with an embodiment of present invention.

The notations in FIG. 1 represent as follows, 10 is an electronic component assembly; 11 is a composite material carrier; 13 is an intermediate layer; 14 is a circuit carrier; 15 is a circuit; 16 is a wiring; 17 is an electronic component; 18 is a connecting means. The same elements in other drawings are represented by the same notations and no description is further directed to.

As shown in FIG. 1, the composite material carrier 11 and the circuit carrier 14 are connected via the intermediate layer 13. The circuit 15 is formed on the circuit carrier 14. The electronic component 17 is mounted on the composite material carrier 11 through the connecting means 18. The connecting means 18 includes, but not limited to, screwing, snap fitting, friction fitting, glue bonding, eutectic bonding, thermal bonding, ultrasonic bonding, pressure bonding, surface active bonding, and the combination thereof. The electronic component 17 can be electrically connected to the circuit 15 through the wiring 16, in flip-chip configuration, or other method for transmitting current and/or signal.

The composite material is made from two or more materials, and the two or more materials are not integrated into another type of molecular or atomic structure. The composite material can have superior physical or chemical properties, for example, the composite material is lighter, stronger, and has a better thermal property. The composite material can be generally categorized into metal matrix composite (MMC), polymer matrix composite (PMC), and ceramic matrix composite (CMC), which are manufactured by mixing carbon fiber or glass fiber with metal, polymer, and ceramics respectively.

In one embodiment, to transmit the massive heat from the electronic component 17, one can choose a metal matrix composite with a thermal conductivity not smaller than 150 W/m° K. and a thermal expansion coefficient not smaller than $1.2 \times 10^{-5}/°C.$, e.g. aluminum matrix composite (an available product in market is with a thermal conductivity of about 100~640 W/m° K. and a thermal expansion coefficient of about $5~15 \times 10^{-5}/°C.$), as the composite material carrier 11. However, the polymer matrix composite and the ceramic matrix composite can be adopted according to the requirement.

In present invention, one material of the circuit carrier 14 is selected from $CaCO_3$, $SiO_2$, $Al_2O_3$, MgO, $Bi_2O_3$, Tc, Pr, Po, Fr, Ra, BeO, $B_2O_3$, $Li_2O$, ZnO, $WS_2$, $RuO_2$, $SnO_2$, $LaB_6$, $In_2O_3$, $Ta_2N$, $BaTiO_3$, CuO, CdO, or $Ta_2O_5$. The Above materials all belong to ceramics.

Besides aforementioned materials, the circuit carrier 14 can be also selected from a printed circuit board (PCB), a flexible printed circuit (FPC), or a semiconductor substrate such as Si substrate. If the semiconductor substrate is selected as the circuit carrier 14, one may use various semiconductor manufacturing processes such as etching and sputtering to make the needed circuit, and may further integrate the semiconductor manufacturing processes with the procedure of making the electronic component. In addition, Si has suitable thermal properties (the thermal conductivity is about 150 W/m° K, and the thermal expansion coefficient is about $4 \times 10^{-6}/°C.$). If a Si substrate is selected to integrate with the composite material carrier 11, especially with the metal matrix composite carrier, due to the closeness of the thermal conductivity and the thermal expansion coefficient between the two materials, the thermal stress can be alleviated and the thermal conducting performance is enhanced. However, the printed circuit board and the flexible printed circuit are also candidates in response to the requirement.

The circuit 15 can be selected from a printed circuit or a sintering ceramic circuit. The sintering ceramic circuit is made by metallic and ceramic materials. The metallic material is selected from Au, Ag, Al, Cu, W, Ni, Pd, Pt, or the combination thereof. The ceramic material is selected from $CaCO_3$, $SiO_2$, $Al_2O_3$, MgO, $Bi_2O_3$, Tc, Tr, Po, Fr, Ra, BeO, $B_2O_3$, $Li_2O$, ZnO, $WS_2$, $RuO_2$, $Bi_2Ru_2O_7$, $PbRu_2O_6$, $IrO_2$, $SnO_2$, $LaB_6$. $In_2O_3$, $Ta_2N$, $BaTiO_3$, CuO, CdO, or $Ta_2O_5$.

The intermediate layer 13 is selected from materials able to properly connect the composite material carrier 11 and the circuit carrier 14. For metal matrix composite, the intermediate layer 13 is able to form a stable connection with both metal and carbon in the composite material. After evaluation, Ni, Ti, Cr, Al, W, Si, and Mo are expected to easily react with carbon to form metal carbide.

The circuit carrier 14 and the composite material carrier 11 of present invention are connected via a connecting means 18. The connecting means 18 can be an adhesive material, preferably, a soft adhesive material layer, more preferably, a soft adhesive material layer preserving an adhesive characteristic at room temperature, or middle to low temperature (for example, 500° C.~50° C.). The soft adhesive material is such as Benzocyclobutene (BCB), epoxy, polyimide, SOG, silicone, solder, Au, Ag, Al, Cu, $CaCO_3$, $SiO_2$, $Al_2O_3$, MgO, $Bi_2O_3$, Tc, BeO, $B_2O_3$, $Li_2O$, $RuO_2$, $SnO_2$, $LaB_6$, $In_2O_3$, $Ta_2N$, $BaTiO_3$, CuO, CdO, $Ta_2O_5$, and the combination thereof. Provided the soft adhesive material can be solidified at a lower temperature (normally, below 300° C.), the thermal stress arose at high temperature between the composite material carrier 11 and the electronic component 17, and between the composite material carrier 11 and the circuit carrier 14 can be alleviated, and the possible damage to the electronic component 17 at high temperature is decreased.

Besides the soft adhesive material layer, a metal layer can be formed on the composite material carrier 11, or on the composite material carrier 11 and the electronic component 17 respectively. A metallic solder layer such as AuSn is introduced between the metal layer and the electronic component 17 or between the two metal layers, and a eutectic bonding is implemented into the solder and the metal layer to connect the electronic component 17 like semiconductor light-emitting device and the composite material carrier.

The electronic component 17 is mounted on the composite material carrier 11 and connected to the circuit 15 via wiring 16 or other electrical connecting means. In addition, the thermal expansion coefficient difference between the electronic component 17 and the composite material carrier 11 is not greater than $1 \times 10^{-5}/°C.$, and therefore the thermal stress induced by the expansion of the electronic component 17 and the composite material carrier 11 is released. Furthermore, the composite material carrier 11 functions not only as the base of the assembly 10 but also as the heat dissipation medium of the electronic component 17.

The electronic component 17 is such as a light-emitting diode (LED), a laser diode (LD), a transistor, a VLSI, and a solar cell. The electronic component 17 in present embodiment is illustrated by a bare LED chip. The primary material of the bare LED chip has a thermal expansion coefficient in the range of $1 \times 10^{-6}/°C.~1 \times 10^{-5}/°C.$, for example, the coefficients of GaN, InP, and GaP are $5.4 \times 10^{-6}/°C.$, $4.6 \times 10^{-6}/°$ C., and 5.3×10⁻⁶/° C., respectively. In present embodiment, the composite material carrier 11 is selected as the carrier base of the assembly 10 to support the circuit carrier 14 and the electronic component 17, and also functions as a heat dissipation medium, so as to match with the electronic component 17 in the thermal expansion coefficient level and prevent an unaffordable thermal stress from occurring in the connection of the electronic component 17 and the contact material. A well-chosen composite material carrier 11, which has a thermal expansion coefficient different from that of the electronic component by $1\times10^{-5}/°$ C. or less, can alleviate the influence of thermal stress.

Figure 2:
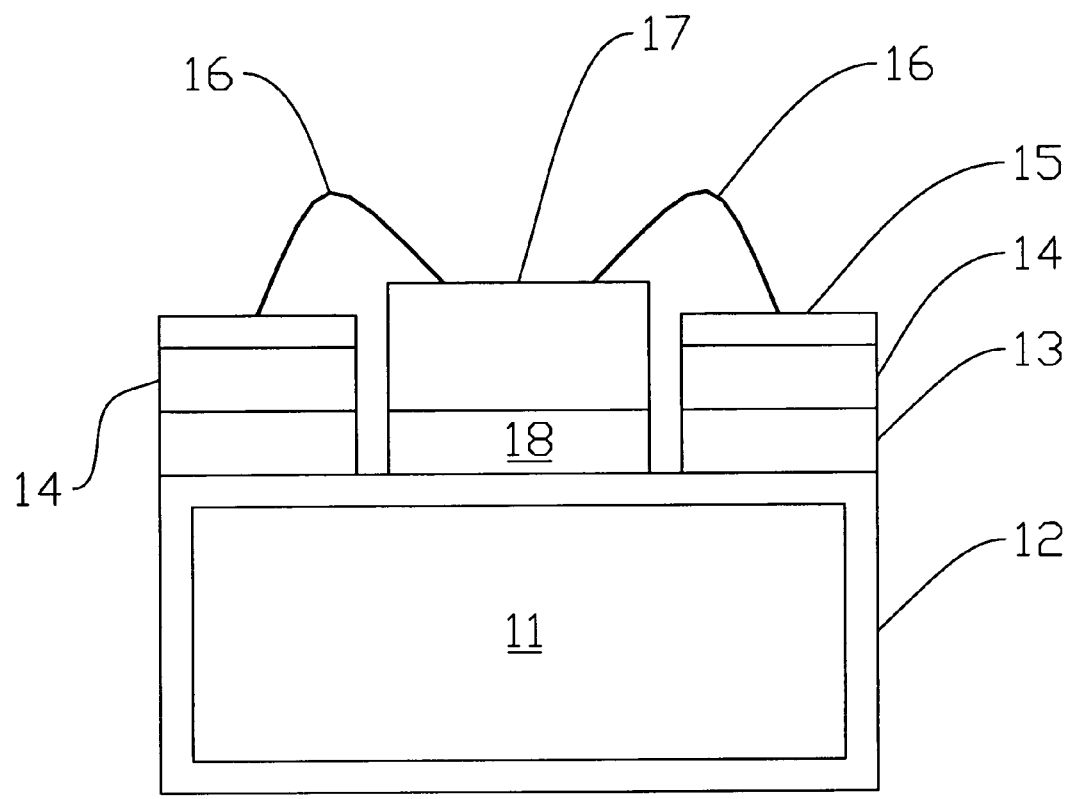
FIG. 2 illustrates an electronic component assembly in accordance with another embodiment of present invention.

As shown is FIG. 2, in the drawing of an electronic component assembly 10 in accordance with another embodiment of present invention, notation 12 is directed to a smoothening layer, and the others are same as those depicted in FIG. 1.

Provided the composite material carrier 11 has a rough surface, a smoothening layer 12 can be formed on whole or part of the outer surface of the composite material carrier 11 to fill in the rough surface of the composite material carrier 11, and accordingly the electronic component 17 and the composite material carrier 11, and/or the intermediate layer 13 and the composite material carrier 11 can be tightly integrated by the connecting means 18. The material of the smoothening layer 12 is selected from Ni or other materials able to enhance the integration quality.

Figure 3:
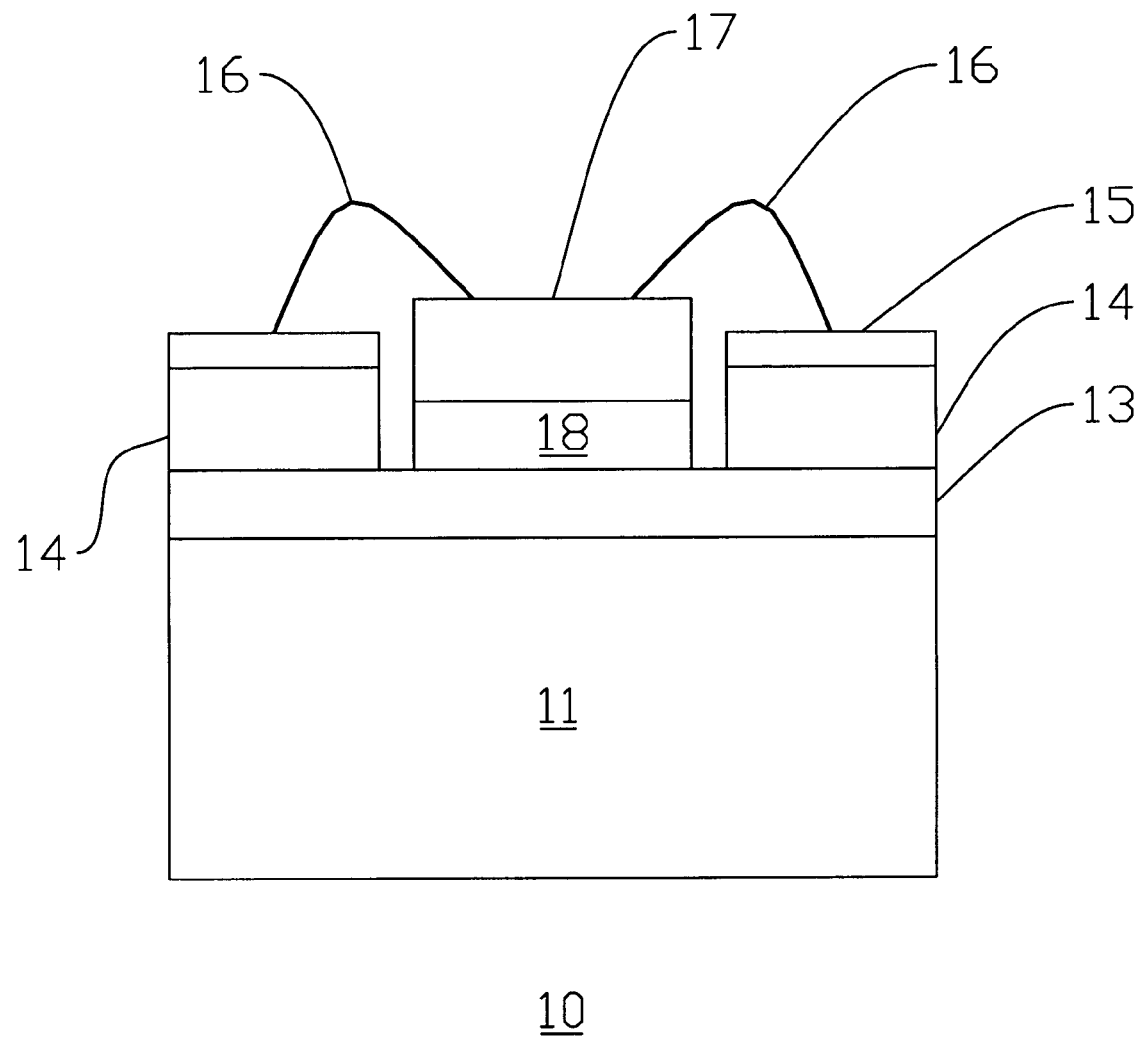
FIG. 3 illustrates an electronic component assembly in accordance with a further embodiment of present invention.
Figure 4A:
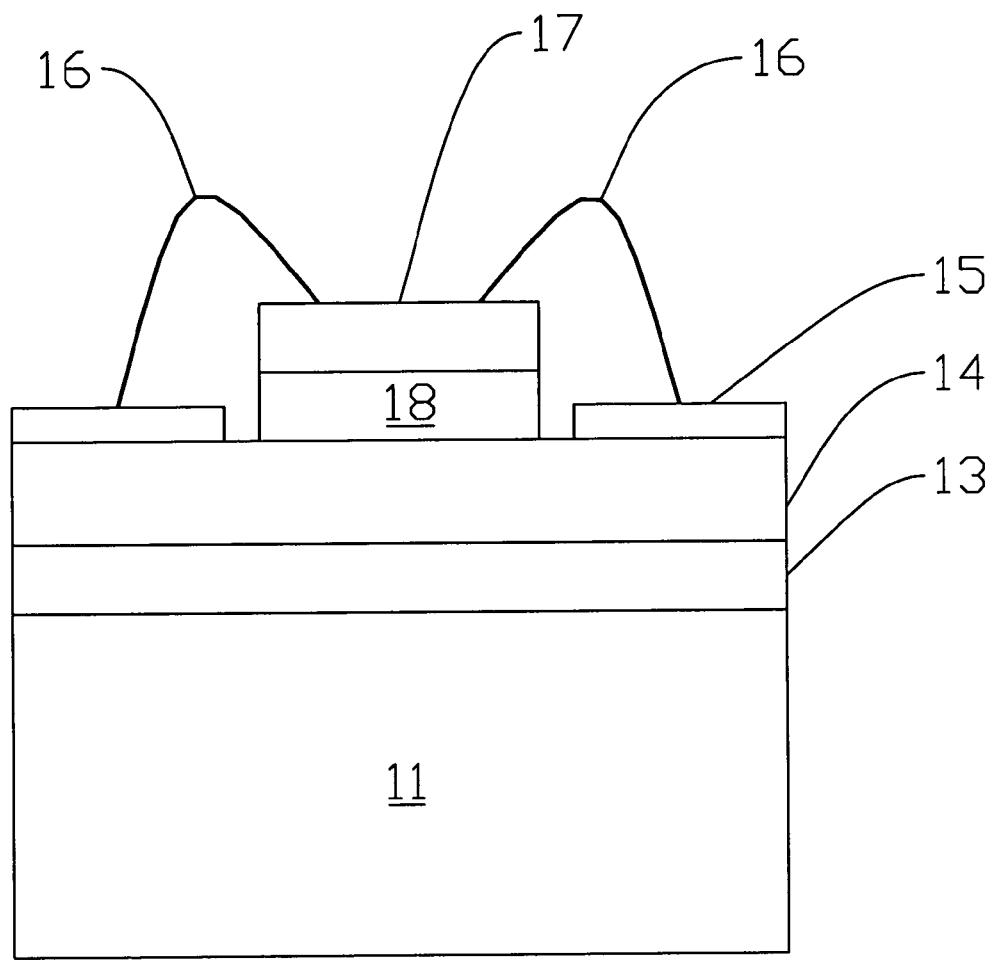
FIGS. 4A and 4B illustrate electronic component assemblies in accordance with another embodiments of present invention.
Figure 4B:
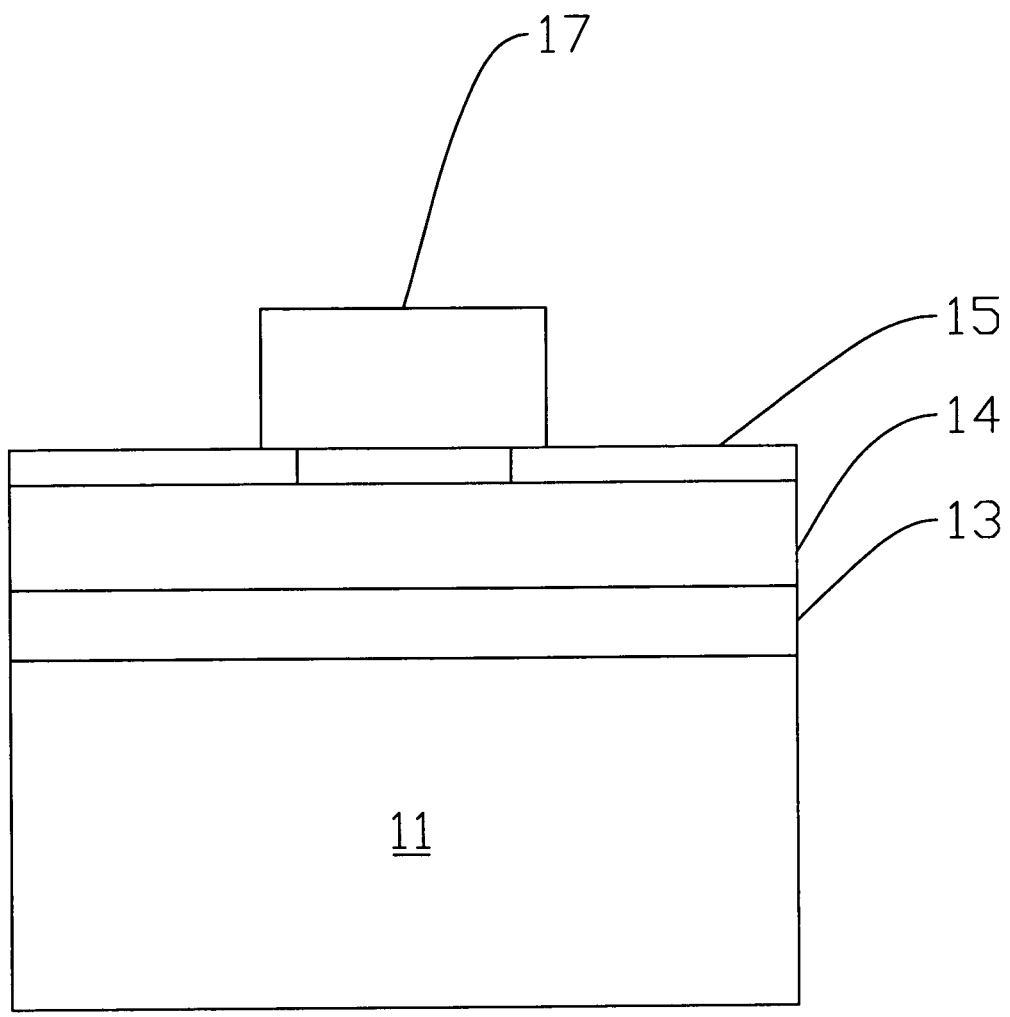

As shown in FIG. 3, a connecting means 18 is optionally introduced between the electronic component 17 and the intermediate layer 13 on which the electronic component is mounted. As shown in FIG. 4A, a connecting means 18 is optionally introduced between the electronic component 17 and the circuit carrier 14 on which the electronic component 17 is mounted. In FIG. 4B, the electronic component 17 is disposed on the circuit 15 in a flip-chip configuration.

The thick film process or the low temperature co-fired ceramics (LTCC) process can be adopted in the manufacture of the assembly of present invention. In a typical LTCC process, a mixture of ceramic powder, organic resin, solvent, and so forth undergoes a tape casting procedure, such that the ceramic material is formed as a green sheet. The wiring is made by printing a paste, which is a mixture of a metallic powder, such as Au, Ag, Cu, W, Ni, Pd, and Pt, and an organic vehicle, on the green sheet. After the co-fired and continued procedures, the LTCC process is complete.

The foregoing description has been directed to the specific embodiments of this invention. It will be apparent; however, that other variations and modifications may be made to the embodiments without escaping the spirit and scope of the invention.

What is claimed is:

1. An electronic component assembly comprising:
   a composite material carrier; wherein the composite material carrier has a thermal expansion coefficient not greater than $1.2\times10^{-5}/°$ C. and a thermal conductivity not less than 150 W/m° K;
   a circuit carrier made of a first dielectric material;
   a circuit formed on the circuit carrier and comprising a conductive material;
   an intermediate layer between the circuit carrier and the composite material carrier, and comprising at least one material selected from the group consisting of Ni, Ti, Cr, Al, W, Si, Mo, metal carbide, and the combination thereof; and
   an electronic component arranged on the composite material carrier and electrically connecting to the circuit.

2. The electronic component assembly of claim 1, further comprising:
   an outer layer covering an outer surface of the composite material carrier.

3. The electronic component assembly of claim 2, wherein the outer layer comprises at least one material selected form the group consisting of Ni, Tim Cr, Cu, Au, Al, Pt, TiW, Pd, and Mo.

4. The electronic component assembly of claim 1, wherein the composite material carrier is selected from the group consisting of metal matrix composite (MMC), polymer matrix composite (PMC), and ceramic matrix composite (CMC).

5. The electronic component assembly of claim 1, wherein the first dielectric material is selected from the group consisting of $CaCO_3$, $SiO_2$, $Al_2O_3$, MgO, $Bi_2O_3$, Tc, Pr, Po, Fr, Ra, BeO, $B_2O_3$, $Li_2O$, ZnO, $WS_2$, $RuO_2$, $SnO_2$, $LaB_6$, $In_2O_3$, $Ta_2N$, $BaTiO_3$, CuO, CdO, and $Ta_2O_5$.

6. The electronic component assembly of claim 1, wherein the circuit carrier further comprises a second dielectric material.

7. The electronic component assembly of claim 6, wherein the second dielectric material is selected from the group consisting of $CaCO_3$, $SiO_2$, $Al_2O_3$, MgO, $Bi_2O_3$, Tc, Tr, Po, Fr, Ra, BeO, $B_2O_3$, $Li_2O$, ZnO, $WS_2$, $RuO_2$, $Bi_2Ru_2O_7$, $PbRu_2O_6$, $IrO_2$, $SnO_2$, $LaB_6$, $In_2O_3$, $Ta_2N$, $BaTiO_3$, CuO, CdO, $Ta_2O_5$.

8. The electronic component assembly of claim 1, wherein the conductive material is selected from the group consisting of Au, Ag, Al, Cu, W, Ni, Pd, and Pt.

9. The electronic component assembly of claim 1, wherein the electronic component is selected from the group consisting of light-emitting diode, laser diode, transistor, integrated circuit, and solar cell.

10. The electronic component assembly of claim 1, wherein the electronic component comprises:
    an n-type semiconductor layer;
    a p-type semiconductor layer; and
    a light-emitting layer between the n-type semiconductor layer and the p-type semiconductor layer.

11. The electronic component assembly of claim 1, wherein the thermal expansion coefficient difference between the composite material carrier and the electronic component is not greater than $1\times10^{-5}/°$ C.

12. The electronic component assembly of claim 1, wherein the composite material carrier comprises at least one material selected from the group consisting of carbon fiber, carbon particulate, carbon flake, carbon laminate, carbon nanotube, diamond, diamond-like carbon, and graphite.

13. The electronic component assembly of claim 1, wherein the electronic component is positioned on the composite material carrier in a flip-chip configuration.

14. The electronic component assembly of claim 1, further comprising:
    a connecting means for connecting the composite material carrier and the electronic component.

15. The electronic component assembly of claim 14, wherein the connecting means is selected from the group consisting of screwing, snap fitting, friction fitting, glue bonding, eutectic bonding, thermal bonding, ultrasonic bonding, pressure bonding, and surface active bonding.

16. The electronic component assembly of claim 14, wherein the connecting means comprises a bonding layer comprising at least one material selected from the group consisting of, Benzocyclobutene (BCB), epoxy, polyimide, SOG, silicone, solder, Au, Ag, Al, Cu, Ni, Pd, Pt, $CaCO_3$, $SiO_2$, $Al_2O_3$, MgO, $Bi_2O_3$, Tc, BeO, $B_2O_3$, $Li_2O$, $RuO_2$, $SnO_2$, $LaB_6$, $In_2O_3$, $Ta_2N$, $BaTiO_3$, CuO, CdO, and $Ta_2O_5$.

* * * * *